(12) United States Patent
Abe et al.

(10) Patent No.: US 6,982,496 B2
(45) Date of Patent: Jan. 3, 2006

(54) SEMICONDUCTOR DEVICE HAVING BUMP ELECTRODE AND SUPPORT AREA

(75) Inventors: Hirofumi Abe, Gamagori (JP); Hiroyuki Ban, Hazu-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/425,664

(22) Filed: Apr. 30, 2003

(65) Prior Publication Data

US 2003/0214034 A1 Nov. 20, 2003

(30) Foreign Application Priority Data

May 17, 2002 (JP) ............................. 2002-142974

(51) Int. Cl.
- *H01L 29/06* (2006.01)
- *H01L 23/48* (2006.01)
- *H01L 23/52* (2006.01)
- *H01L 29/40* (2006.01)
- *H01L 23/544* (2006.01)

(52) U.S. Cl. ...................... 257/797; 257/620; 257/737; 257/780

(58) Field of Classification Search ................ 257/620, 257/797, 780, 737, 786, 738, 686, 723, 778, 257/777, 773

See application file for complete search history.

(56) References Cited

U.S. PATENT DOCUMENTS

| | | | | |
|---|---|---|---|---|
| 5,880,017 A | * | 3/1999 | Schwiebert et al. | 438/613 |
| 5,990,418 A | * | 11/1999 | Bivona et al. | 174/52.4 |
| 6,294,406 B1 | * | 9/2001 | Bertin et al. | 438/109 |
| 6,339,254 B1 | * | 1/2002 | Venkateshwaran et al. | 257/686 |
| 6,418,029 B1 | * | 7/2002 | McKee et al. | 361/760 |
| 6,455,920 B2 | * | 9/2002 | Fukasawa et al. | 257/620 |
| 6,560,122 B2 | * | 5/2003 | Weber | 361/783 |
| 6,703,697 B2 | * | 3/2004 | Leahy et al. | 257/678 |
| 6,784,542 B2 | * | 8/2004 | Fukasawa et al. | 257/730 |
| 6,798,076 B2 | * | 9/2004 | Horigan et al. | 257/786 |
| 2001/0026021 A1 | * | 10/2001 | Honda | 257/778 |
| 2001/0028110 A1 | * | 10/2001 | Andoh | 257/737 |
| 2003/0025187 A1 | * | 2/2003 | Strutz et al. | 257/684 |
| 2003/0030137 A1 | * | 2/2003 | Hashimoto | 257/690 |
| 2004/0012088 A1 | * | 1/2004 | Fukasawa et al. | 257/737 |
| 2004/0117977 A1 | * | 6/2004 | Hiramatsu et al. | 29/611 |

\* cited by examiner

*Primary Examiner*—Nathan J. Flynn
*Assistant Examiner*—Victor A. Mandala, Jr.
(74) *Attorney, Agent, or Firm*—Posz Law Group, PLC

(57) ABSTRACT

A semiconductor device includes a substrate, a plurality of bump electrodes disposed on the substrate, and a support area for supporting the substrate in case of carrying the substrate. The support area is disposed on a surface of the substrate, on which the bump electrode is disposed, and is disposed at a predetermined position, which is dotted on the surface of the substrate. In this device, the support area is sufficiently small, and the number of the bump electrodes can increase. Moreover, degree of freedom in a configuration of the support area increases.

16 Claims, 6 Drawing Sheets

SEMICONDUCTOR DEVICE HAVING BUMP ELECTRODE AND SUPPORT AREA

CROSS REFERENCE TO RELATED APPLICATION

This application is based on Japanese Patent Application No. 2002-142974 filed on May 17, 2002, the disclosure of which is incorporated herein by reference.

FIELD OF THE INVENTION

The present invention relates to a semiconductor device having a plurality of bump electrodes.

BACKGROUND OF THE INVENTION

Semiconductor devices have a plurality of bump electrodes, which are formed on one side of a semiconductor substrate. Some of these devices have a chip size package structure, i.e., CSP structure. The CSP structure provides that a size of a chip is almost equal to a size of a package. The semiconductor device with CSP structure can be used as a power electronic device, so that comparably heavy current flows in an electric circuit of the power electronic device.

As shown in FIG. 5, a semiconductor device 20 with CSP structure according to a related art includes a plurality of bump electrodes 6a, which is disposed on the upper surface 20a of a semiconductor substrate 1. As shown in FIG. 6, the bump electrodes 6a are formed on a predetermined area of the upper surface 20a. This predetermined area is surrounded with a support area 8.

The support area 8 is needed for supporting the semiconductor device 20. In general, the semiconductor device 20 is carried by a tray 10, which is a container having a plate-like shape, as shown in FIG. 7. The tray 10 with a cap 11 supports both sides of the semiconductor device 20. The cap 11 supports the lower surface 20b of the semiconductor device 20, which is opposite to the upper surface 20a of the semiconductor device 20, so that all of the lower surface 20b is covered with the cap 11. On the upper surface 20a, the semiconductor device 20 is supported with the tray 10, so that the support area 8 of the upper surface 20a is covered with the tray 10. Therefore, the support area 8 is needed for carrying the semiconductor device 20.

In recent years, more and more bump electrodes 6a are required as external connection terminals, because of a high-density integration and a multipurpose electric circuit. Therefore, a wide area for forming the bump electrode 6a is needed. However, no bump electrode 6a can be formed on the support area 8, which is disposed on the peripheral surface of the upper surface 20a so as to support the semiconductor device 20. Thus, it is difficult to increase the bump electrode 6a.

SUMMARY OF THE INVENTION

In view of the above-mentioned problem, it is an object of the present invention to provide a semiconductor device with a plurality of bump electrodes, in which a number of the bump electrodes can be formed sufficiently large.

A semiconductor device having a plurality of bump electrodes includes a substrate, a plurality of bump electrodes disposed on the substrate, and a support area for supporting the substrate in case of carrying the substrate. The support area is disposed on a surface of the substrate, the surface on which the bump electrode is disposed, and is disposed at a predetermined position, which is dotted or separated into parts on the surface of the substrate. In this device, the support area is sufficiently small, and the number of the bump electrode can increase. Moreover, degree of freedom in a configuration of the support area also increases.

Preferably, the support area is disposed on the peripheral end of the surface of the substrate. More preferably, the support area is disposed only at four corners of the substrate, when the substrate has four corners.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

A semiconductor device with CSP structure, according to an embodiment of the present invention, is used as a power electronic device.

Figure 1:
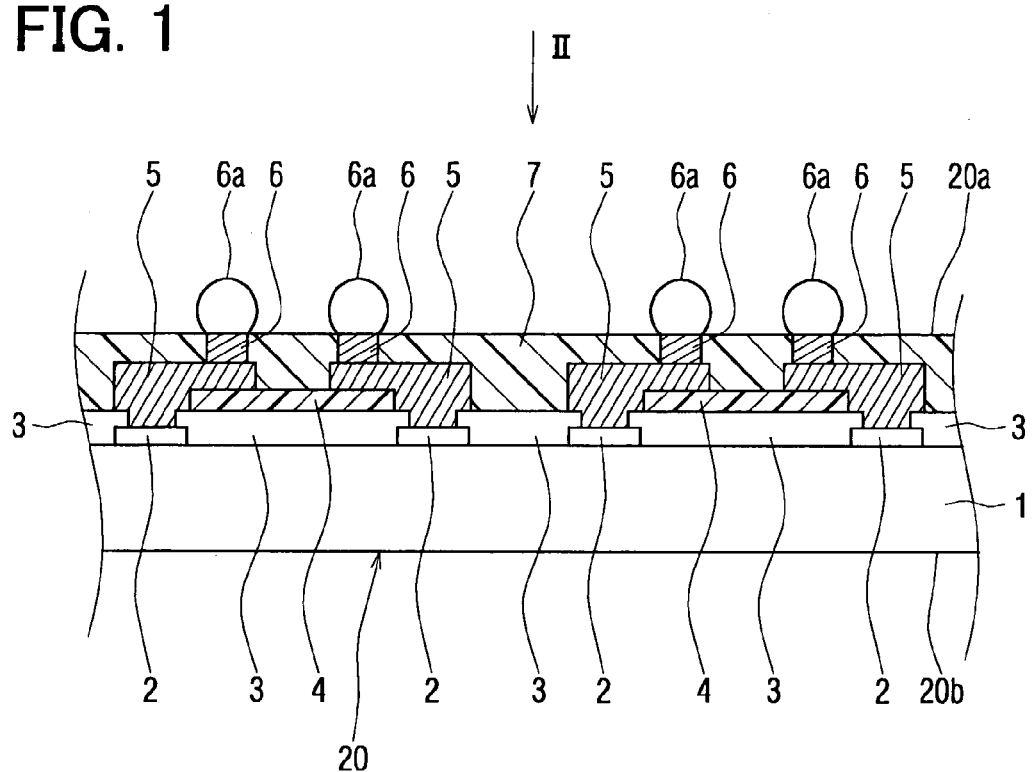
FIG. 1 is a partially cross-sectional view showing a semiconductor device according to an embodiment of the present invention.
Figure 5:
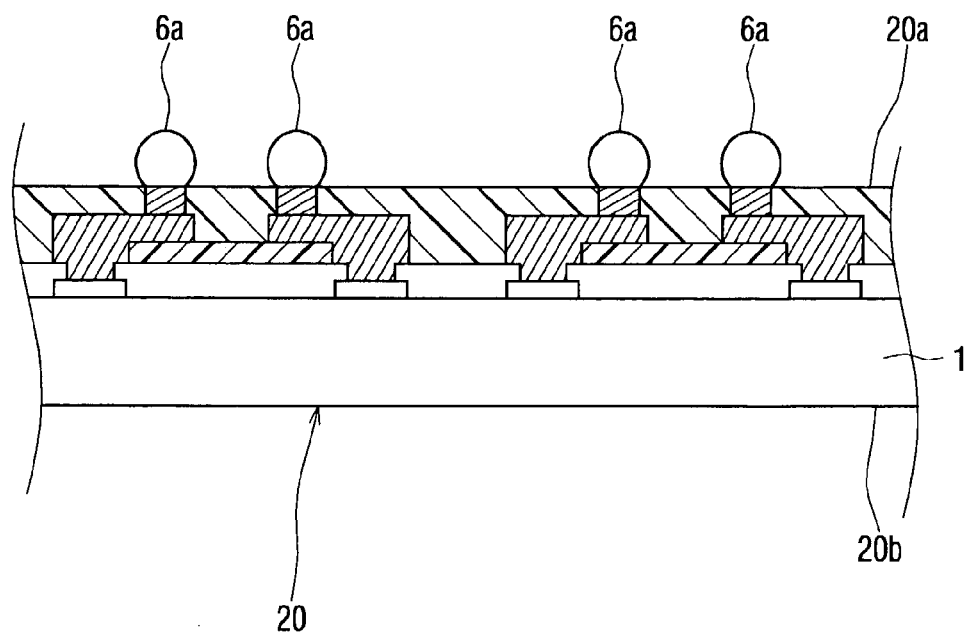
FIG. 5 is a partially cross-sectional view showing a semiconductor device according to a related art.
Figure 2:
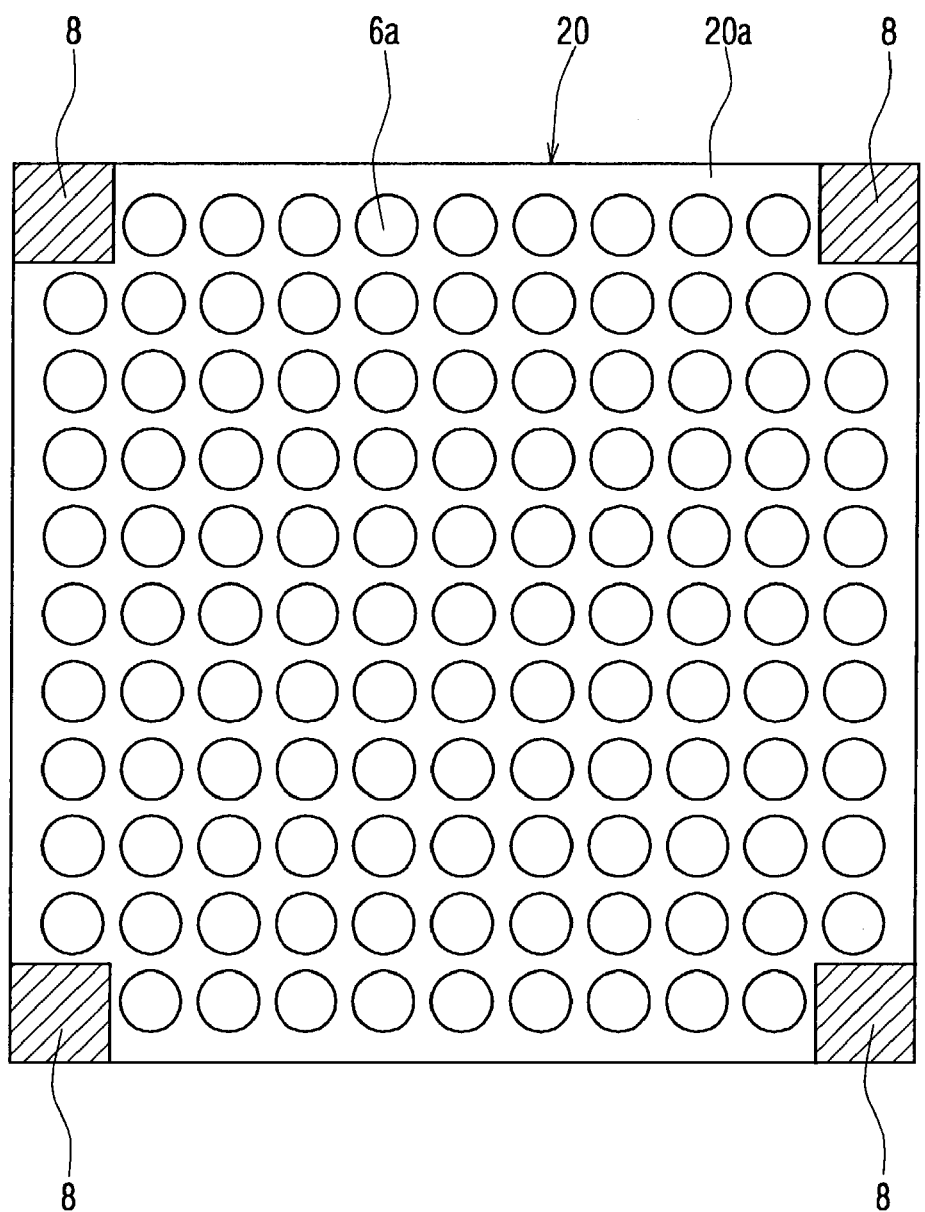
FIG. 2 is a top view of the semiconductor device viewed in an arrow direction II in FIG. 1.

As shown in FIGS. 1 and 2, a semiconductor device 20 includes a semiconductor substrate 1 and a plurality of connection pads 2, which is formed on the upper surface 20a of the semiconductor substrate 1. The connection pad 2 is made of aluminum, and each connection pad 2 has an equal electric potential, for example, a source potential or a drain potential.

The connection pad 2 is covered with a passivation film 3 made of silicon oxide or silicon nitride, so that only a center portion of the surface of the connection pad 2 opens through the passivation film 3. An insulation film 4 is formed on the passivation film 3, so that the connection pad 2 also opens through the insulation film 4, and an electrode 6 is disposed on the insulation film 4. The insulation film 4 is made of poly-imide resin and the like. Thus, the CPS structure is prepared.

The connection pad 2 and the electrode 6 are electrically connected with a printed circuit 5, which is disposed on the insulation film 4. The electrode 6 is formed at a predetermined position on the insulation film 4. The electrode 6, the printed circuit 5, the insulation film 4, and the passivation film 3 are covered with a sealing film 7 so that all of the upper surface 20a of the semiconductor device 20 is covered with the sealing film 7 except for the electrode 6. The sealing film 7 is made of epoxy resin, acrylic resin, poly-imide resin, or the like. A bump electrode 6a is disposed on the electrode 6, which is exposed from the sealing film 7.

Figure 6:
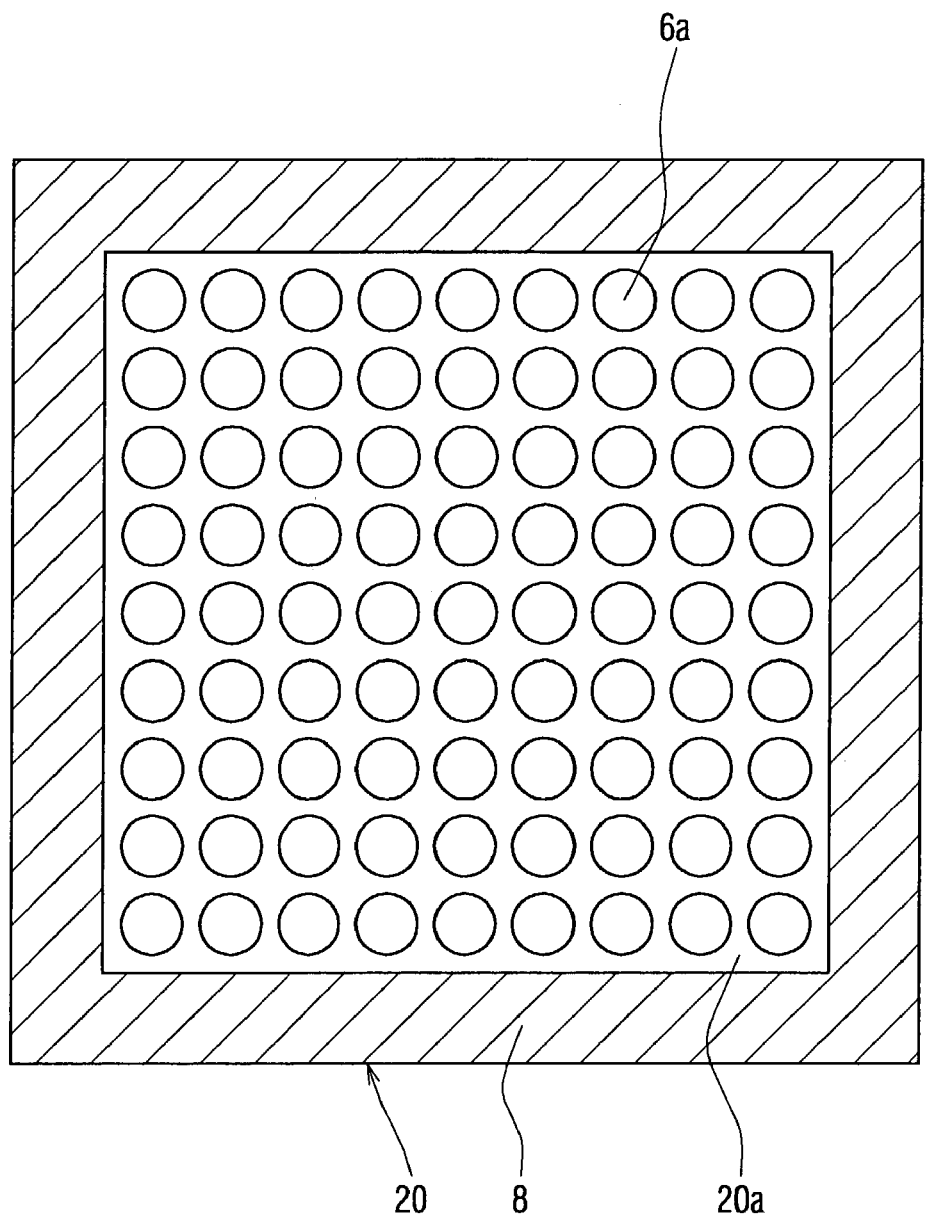
FIG. 6 is a top view of the semiconductor device viewed in an arrow direction VI in FIG. 5.
Figure 7:
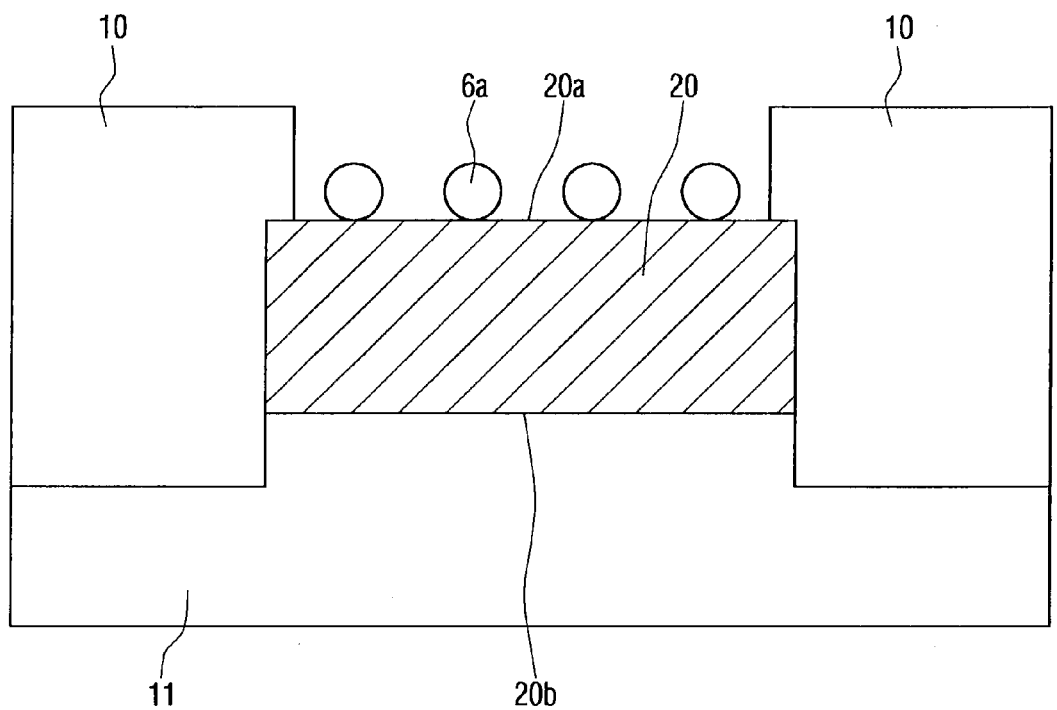
FIG. 7 is a cross-sectional view explaining a carrying system of the semiconductor device according to the related art.

As shown in FIG. 2, a support area 8 is disposed on the upper surface 20a of the semiconductor substrate 1, and is disposed only at four corners of the semiconductor device 20. Here, on the support area 8, no bump electrode is formed. The support area 8 is smaller than that of the related art shown in FIG. 6. Therefore, an area where the bump electrode 6a is formed is larger than that of the related art, and the number of the bump electrodes 6a increases than the related art.

Thus, since the support area 8 is dotted or separated into parts on the upper surface 20a of the semiconductor substrate 1, degree of freedom in a configuration of the support area 8 increases.

The semiconductor device 20 is manufactured as follows.

Figure 3A:
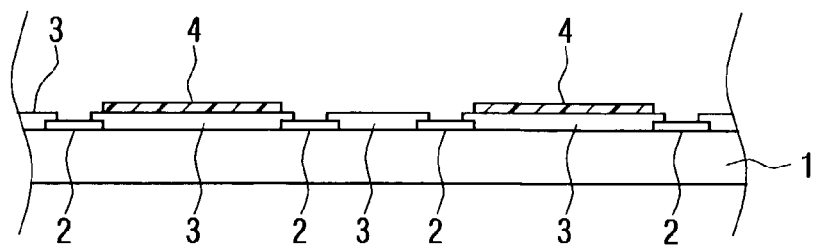
FIGS. 3A to 3E are partially cross-sectional views showing a manufacturing process of the semiconductor device according to the embodiment.

As shown in FIG. 3A, the connection pad 2 made of aluminum is formed on the semiconductor substrate 1. On the connection pad 2, the passivation film 3 is formed so as to expose only the center portion of the connection pad 2. The passivation film 3 is made of silicon oxide film or silicon nitride film as insulation.

Next, the insulation film 4 is formed on the passivation film 3 so as to expose only the center portion of the connection pad 2. Further, the insulation film 4 is prepared for forming the electrode 6 thereon later. The insulation film 4 is formed by the following manner. A poly-imide resin is coated on the semiconductor substrate 1, and is hardened. After that, the poly-imide resin film is patterned to form the insulation film 4 with using photo-resist pattern. Then, the photo-resist is removed.

Figure 3B:
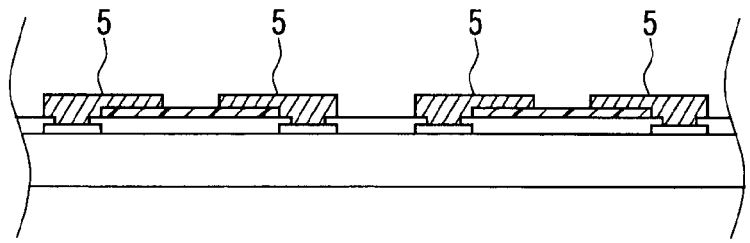

Next, the printed circuit 5 is formed on the insulation film 4, as shown in FIG. 3B. The printed circuit 5 is prepared as follows. A photo-resist for conductive layer type is coated on the insulation film 4. This photo-resist is hardened and patterned into a predetermined pattern with using photo-lithography method. This predetermined pattern has a plurality of openings, and the openings are filled with copper, aluminum, or the like by electrolytic plating method. After removing the photo-resist, the printed circuit 5 is formed.

Figure 3C:
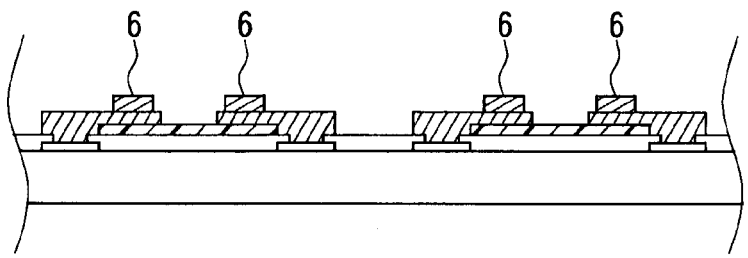

As shown in FIG. 3C, the electrode 6 is formed on the printed circuit 5 at a predetermined position. The electrode 6 is made of conductive material such as copper or solder. The electrode 6 is prepared as follows. A photo-resist for forming the electrode 6 is coated on the printed circuit 5. The photo-resist is hardened and patterned into a predetermined pattern with using photo-lithography method. The predetermined pattern has a plurality of openings, and the openings are filled with copper, solder or the like by electrolytic plating method. After removing the photo-resist, the electrode 6 is formed.

Figure 3D:
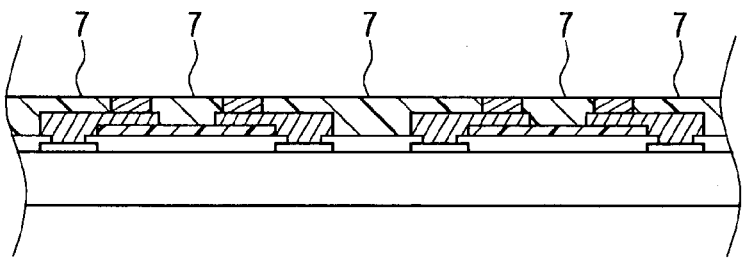

Then, for example, epoxy resin is coated to cover the semiconductor substrate 1. The epoxy resin is hardened and ground so that the upper surface of the electrode 6 appears from the epoxy resin layer. Thus, the sealing film 7 is formed, as shown in FIG. 3D.

Figure 3E:
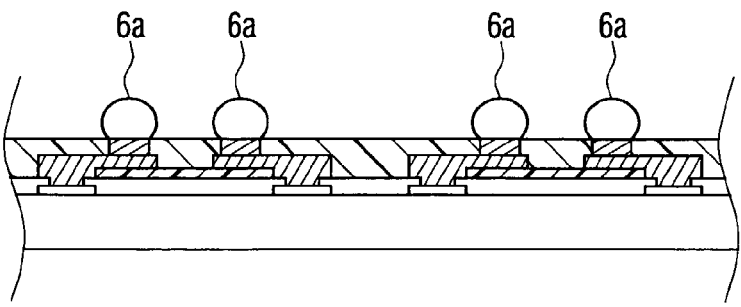

After that, as shown in FIG. 3E, the bump electrode 6a is formed on the electrode 6 so as to connect to the electrode 6 electrically. Here, the bump electrode 6a is formed on all over the upper surface 20a, except for the support area 8, which is located at four corners of the upper surface 20a. Thus, the semiconductor device 20 is completed. The semiconductor device 20 is thus enabled to be carried out by being held at its support area.

Figure 4A:
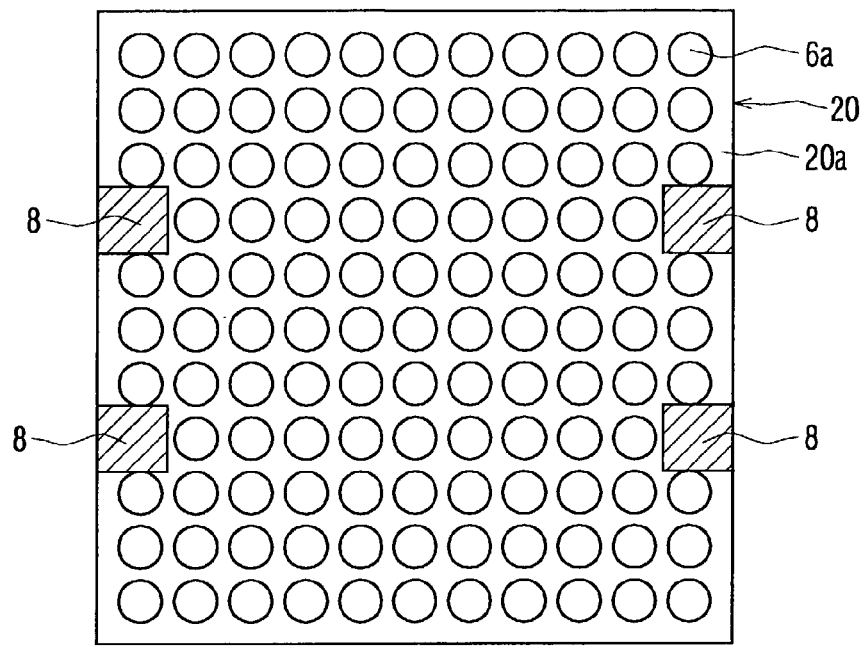
FIGS. 4A and 4B are top views showing semiconductor devices according to other embodiments of the present invention.
Figure 4B:
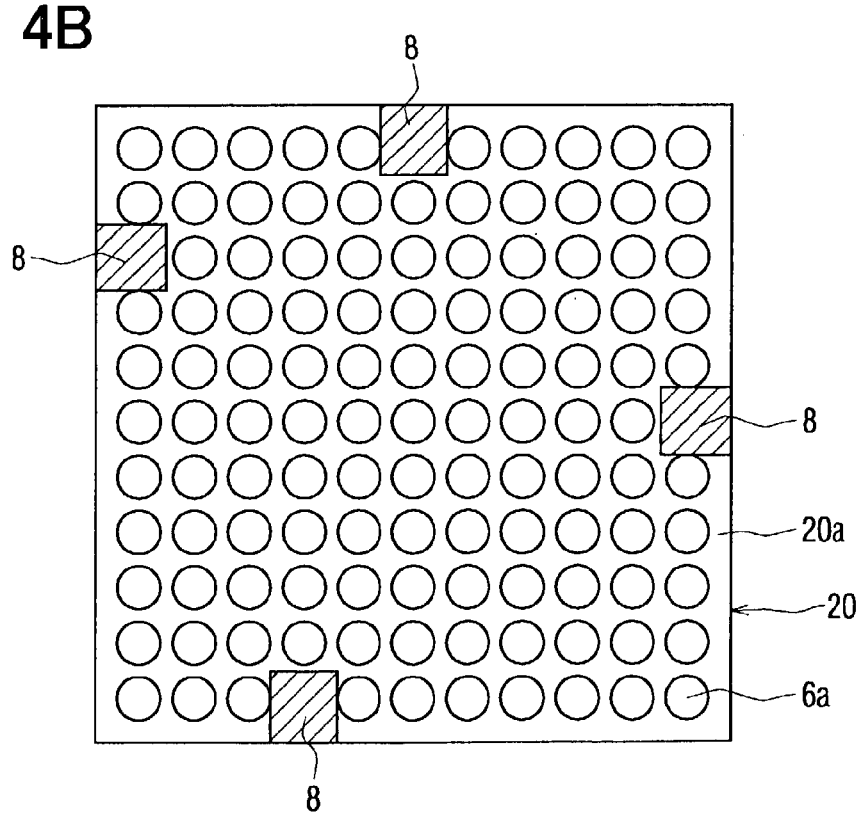

In the above embodiment, the support area 8 is disposed only at four corners of the semiconductor device 20. However, the support area 8 can be formed at various positions, for example, at positions immediately adjacent the sides of the substrate 1 as shown in FIG. 4A or 4B.

Although the support area 8 has a square shape and four areas, another shape and number of support area can be available. For example, the support area 8 may have three or five areas, each of which is a circle. Moreover, although the semiconductor substrate 1 is a square, another semiconductor substrate can be used as the substrate 1. For example, the substrate 1 may have a disk shape or the like. Further, the substrate 1 can be made of another material such as resin material.

Although the insulation film 4 is formed on the passivation film 3, the insulation film 4 can be omitted. For example, the passivation film 3 may be used as the insulation film 4. In this case, the printed circuit 5 and the sealing film 7 are formed on the passivation film 3.

Alternatively, the support area 8 can be formed by the following method. At first, a plurality of bump electrodes 6a is formed on an entire upper surface 20a of the substrate 1. Then, predetermined bump electrodes 6a are eliminated so that the support area 8 is formed. For example, the bump electrode 6a is eliminated with a grinder.

Although the present invention has been fully described in connection with the preferred embodiment and modifications thereof with reference to the accompanying drawings, it is to be noted that further changes and modifications will become apparent to those skilled in the art.

What is claimed is:

1. A semiconductor device, comprising:
   a substrate;
   a plurality of bump electrodes disposed on the substrate; and
   a support area for supporting the substrate in case of carrying the substrate,
   wherein the support area is disposed directly on a surface of the substrate, and is disposed at a predetermined position which is dotted on the surface of the substrate,
   wherein the plurality of bump electrodes are disposed directly on the same surface of the substrate as the support area, and
   wherein the support area includes a part of the surface of the substrate on which none of the plurality of bump electrodes is disposed.

2. A semiconductor device according to claim 1, wherein the support area is disposed on a peripheral end of the surface of the substrate.

3. A semiconductor device according to claim 1,
   wherein the substrate has four corners, and
   wherein the support area is disposed on the four corners of the substrate.

4. A semiconductor device according to claim 1, wherein the support area and the surface of the substrate are disposed on the same plane.

5. A semiconductor device according to claim 1, wherein the support area has a surface which coincides with the surface of the substrate, and wherein the surface of the support area is exposed outside of the substrate so that the substrate is supportable at the support area.

6. A semiconductor device according to claim 1, wherein the support area is a predetermined area of the substrate so that the substrate is supportable at the support area.

7. A semiconductor device according to claim 1, wherein the support area is covered with an insulation film.

8. A semiconductor device, comprising:
a substrate;
a plurality of bump electrodes disposed directly on the substrate; and
a support area for supporting the substrate in case of carrying the substrate,
wherein the support area is formed in such a manner that a plurality of predetermined bump electrodes is eliminated so as to form the support area at a predetermined position, which is dotted directly on the surface of the substrate.

9. A semiconductor device, comprising:
a substrate;
a plurality of bump electrodes disposed directly on the substrate; and
a plurality of support areas disposed directly on the substrate and adjacent to the bump electrodes, the support areas being located along sides of the substrate and separated one another to allow a part of bump electrodes to be located immediately adjacent to the sides of the substrate,
wherein each of the plurality of support areas includes a part of a surface of the substrate on which none of the plurality of bump electrodes is disposed.

10. A semiconductor device according to claim 9, wherein the substrate is supportable with the support areas in case of carrying the substrate.

11. A semiconductor device according to claim 10, wherein the support area is only disposed adjacent to a periphery of the substrate.

12. A semiconductor device according to claim 11, wherein the support area has a substantial area, which is equal to that of the bump electrode.

13. A semiconductor device according to claim 12, wherein the support area is surrounded by the three bump electrodes.

14. A semiconductor device according to claim 13, wherein the support area is disposed only at four corners of the substrate.

15. A semiconductor device according to claim 14, wherein the substantial area of the support area is provided by removing one bump electrode from the substrate.

16. A semiconductor device according to claim 4, wherein the support area is a part of the substrate.

* * * * *